United States Patent
Sankin et al.

(10) Patent No.: US 7,960,198 B2
(45) Date of Patent: Jun. 14, 2011

(54) METHOD OF MAKING A SEMICONDUCTOR DEVICE WITH SURGE CURRENT PROTECTION

(75) Inventors: Igor Sankin, Starkville, MS (US); Joseph Neil Merrett, Starkville, MS (US)

(73) Assignee: Semisouth Laboratories, Starkvilles, MS (US)

( * ) Notice: Subject to any disclaimer, the term of this patent is extended or adjusted under 35 U.S.C. 154(b) by 644 days.

(21) Appl. No.: 11/819,646

(22) Filed: Jun. 28, 2007

(65) Prior Publication Data
US 2008/0160685 A1    Jul. 3, 2008

Related U.S. Application Data

(62) Division of application No. 11/415,279, filed on May 2, 2006, now Pat. No. 7,274,083.

(51) Int. Cl.
*H01L 31/075* (2006.01)
*H01L 33/00* (2010.01)

(52) U.S. Cl. ............... 438/34; 438/29; 438/31; 438/35; 438/39; 438/42; 438/45; 438/46; 438/571; 438/572; 257/409; 257/452; 257/484; 257/594; 257/E33.054; 257/E31.099

(58) Field of Classification Search ............ 257/46, 257/104–106, E29.34, E29.179, E29.192, 257/E21.353, E21.367, E21.404, E29.339–E29.341, 257/109, 113–118, 127, 170, 233, 288–292, 257/409, 484, 452, 594, 655–656, 910, E33.054, 257/E31.058–E31.06, E31.063–E31.066, 257/E31.099, E29.012–E29.013, E31.105, 257/E27.133, E25.032; 438/22–47, 141, 438/421, 570–583, FOR. 157, FOR. 287, 438/FOR. 415, FOR. 416, FOR. 417
See application file for complete search history.

(56) References Cited

U.S. PATENT DOCUMENTS

| | | | |
|---|---|---|---|
| 4,982,260 A | 1/1991 | Chang et al. | |
| 5,449,925 A | 9/1995 | Baliga et al. | |
| 6,104,043 A | 8/2000 | Hermansson et al. | |
| 6,175,143 B1 | 1/2001 | Fujihira et al. | |
| 6,524,900 B2 | 2/2003 | Dahlqvist et al. | |
| 6,573,128 B1 | 6/2003 | Singh | |
| 6,693,308 B2 * | 2/2004 | Sankin et al. | 257/103 |
| 6,815,304 B2 * | 11/2004 | Sankin et al. | 438/348 |
| 6,838,710 B1 * | 1/2005 | Barkhordarian | 257/199 |

(Continued)

OTHER PUBLICATIONS

Neudeck et al. (Measurements of Breakdown Field and Forward Current Stability in 3C-SiC pn junction diodes grown on step-free 4H-SiC, Silicon Carbide and Related Materials, 2005).*

(Continued)

*Primary Examiner* — Matthew C Landau
*Assistant Examiner* — Maliheh Malek
(74) *Attorney, Agent, or Firm* — Morris, Manning & Martin, LLP; Christopher W. Raimund

(57) ABSTRACT

A wide bandgap semiconductor device with surge current protection and a method of making the device are described. The device comprises a low doped n-type region formed by plasma etching through the first epitaxial layer grown on a heavily doped n-type substrate and a plurality of heavily doped p-type regions formed by plasma etching through the second epitaxial layer grown on the first epitaxial layer. Ohmic contacts are formed on p-type regions and on the backside of the n-type substrate. Schottky contacts are formed on the top surface of the n-type region. At normal operating conditions, the current in the device flows through the Schottky contacts. The device, however, is capable of withstanding extremely high current densities due to conductivity modulation caused by minority carrier injection from p-type regions.

16 Claims, 7 Drawing Sheets

U.S. PATENT DOCUMENTS

| | | | |
|---|---|---|---|
| 6,861,723 | B2 | 3/2005 | Willmeroth |
| 6,897,133 | B2 | 5/2005 | Collard |
| 7,095,050 | B2 * | 8/2006 | Wanlass et al. ............... 257/79 |
| 7,173,311 | B2 * | 2/2007 | Sato et al. .................... 257/355 |
| 7,242,040 | B2 * | 7/2007 | Sankin et al. ................ 257/263 |
| 7,274,083 | B1 * | 9/2007 | Sankin et al. ................ 257/471 |
| 7,416,929 | B2 * | 8/2008 | Mazzola et al. ............. 438/186 |
| 7,510,921 | B2 * | 3/2009 | Sankin et al. ................ 438/167 |
| 7,556,994 | B2 * | 7/2009 | Sankin et al. ................ 438/186 |
| 7,700,960 | B2 * | 4/2010 | Kim et al. ..................... 257/88 |
| 2001/0054715 | A1 | 12/2001 | Collard et al. |
| 2003/0045035 | A1 | 3/2003 | Shenai et al. |
| 2003/0162355 | A1 * | 8/2003 | Sankin et al. ................ 438/268 |
| 2004/0159865 | A1 * | 8/2004 | Allen et al. .................. 257/280 |
| 2006/0113561 | A1 * | 6/2006 | Sankin et al. ................ 257/134 |
| 2007/0122951 | A1 * | 5/2007 | Sankin et al. ................ 438/167 |
| 2007/0200115 | A1 * | 8/2007 | Das et al. ...................... 257/77 |
| 2007/0262323 | A1 * | 11/2007 | Sonobe et al. ................ 257/77 |
| 2008/0003731 | A1 * | 1/2008 | Mazzola et al. ............. 438/192 |
| 2008/0042203 | A1 * | 2/2008 | Hovel et al. .................. 257/347 |
| 2008/0093637 | A1 * | 4/2008 | Sankin et al. ................ 257/263 |
| 2008/0251796 | A1 * | 10/2008 | Lee et al. ....................... 257/88 |

OTHER PUBLICATIONS

B.J. Baliga, "Analysis of a high-voltage merged p-i-n/Schottky (MPS) rectifier," IEEE Electron Device Letters, vol. 8, Issue 9, Sep. 1987 pp. 407-409.

W.V. Muench and I. Plaffeneder: "Breakdown field in vapor-grown silicon carbide p-n junctions," Journal of Applied Physics, vol. 48, No. 11, Nov. 1977.

V.E. Chelnokov, A.M. Strel'chuk, P.A. Ivanov; G. Lentz, C. Parniere: "Silicon carbide p-n structures as power rectifiers," Proceedings of the 6th International Symposium on Power Semiconductor Devices and ICs, 1994. ISPSD '94, pp. 253-256.

K.V. Vasilevskki, K. Zekentes, A.V. Zorenko, and L.P. Romanov: "Experimental Determination of Electron Drift Velocity in 4H-SiC p+-n-n+ Avalanche Diodes," IEEE Electron Device Letters, vol. 21, No. 10, Oct. 2000 pp. 485-487.

L. Yuan, J.A. Cooper, Jr., M.R. Melloch, and K.J. Webb: "Experimental Demonstration of a Silicon Carbide IMPATT Oscillator," IEEE Electron Device Letters, vol. 22, No. 6, Jun. 2001, pp. 266-268.

D.T. Morisette and J.A. Cooper, Jr: "Theoretical Comparison of SiC PiN and Schottky Diodes Based on Power Dissipation Considerations," IEEE Transactions on Electron Devices, vol. 49, No. 9, Sep. 2002, pp. 1657-1664.

I. Sankin, J.B. Casady, "Power SiC MOSFETs," book chapter: Advances in Silicon Carbide Processing and Applications, S. E. Saddow and A. Agrawal, Editors.

H. Saitoh, T. Kimoto, and H. Matsunami: "Origin of Leakage current in SiC Schottky Barrier Diodes at High Temperature," Material Science Forum vols. 457-460 (2004) pp. 997-1000.

A.O. Konstantinov, Q. Wahab, N. Nordell, U. Lindefelt: "Ionization rates and critical fields in 4H silicon carbide," Appl. Phys. Lett., vol. 71, No. 1, Jul. 7, 1997, pp. 90-92.

\* cited by examiner

US 7,960,198 B2

METHOD OF MAKING A SEMICONDUCTOR DEVICE WITH SURGE CURRENT PROTECTION

CROSS REFERENCE TO RELATED CASES

This application is a divisional of U.S. patent application Ser. No. 11/415,279, filed May 2, 2006, which is incorporated by reference herein in its entirety.

STATEMENT REGARDING FEDERALLY SPONSORED RESEARCH

This invention was made with U.S. Government support under Air Force Research Laboratory Agreement No. F33615-02-D-2103. The U.S. Government may have certain rights in this invention.

BACKGROUND

1. Technical Field

The application relates generally to semiconductor devices in wide-bandgap semiconductor materials and, in particular, to diodes (including Schottky barrier diodes and bipolar junction diodes) made in silicon carbide (SiC) and to structures that monolithically integrate these diodes, including structures having mesa edge termination.

2. Background of the Technology

Monolithic devices comprising Schottky and PiN diodes are known (See, for example, U.S. Pat. No. 6,861,723 and [1]). U.S. Pat. No. 6,573,128 discloses a SiC Junction Barrier Schottky (JBS)/Merged P-I-N Schottky (MPS) grid that is formed of Schottky metal deposited on p-type islands defined by plasma etching through an epitaxially grown layer. However, this structure is unable to effectively protect itself from a surge current because of the absence of p-type ohmic contacts on the p-type regions and insufficient conductivity modulation caused by low doping of p-type regions.

U.S. Pat. Nos. 6,104,043 and 6,524,900 disclose JBS/MPS diodes having heavily doped p-type regions formed by ion implantation. If ohmic contacts to heavily doped implanted p-type regions are formed as disclosed in U.S. Pat. No. 6,104,043, however, the conductivity modulation in the drift region of such a structure suffers from low minority carrier lifetime caused by residual implantation damage even after thermal anneal at high temperature.

U.S. Pat. No. 4,982,260 describes the definition of p-type emitter regions by etching through the heavily doped p-type well created by diffusion. However, since diffusion of dopants into SiC occurs very slowly at even extremely high temperatures, as a practical matter, a p-type well can only be formed in n-type SiC by ion implantation, which has the disadvantage described above.

U.S. Pat. No. 6,897,133 describes forming p-type emitter regions by etching trenches in n-type material and filling them with p-type epitaxially grown material followed by chemical-mechanical polishing or another planarization step. This device, however, has JFET regions that may significantly limit current conduction under normal operating conditions.

SiC devices that employ mesa edge termination are also known [2]. Mesa edge termination technology for Si, however, is generally inapplicable to SiC device technology due to difficulties related to etching of SiC and removing the damage caused by the etching process (See, for example, U.S. Pat. No. 5,449,925 and [3]). The use of mesa termination in 4H—SiC diodes has also been disclosed (U.S. Pat. No. 6,897,133, [4], and [5]).

There still exists a need for semiconductor devices having improved properties.

SUMMARY

According to a first embodiment, a method of making a semiconductor device is provided which comprises:

selectively etching through a layer of p-type SiC semiconductor material on a layer of n-type SiC semiconductor material on an n-type SiC semiconductor substrate layer to expose underlying n-type SiC semiconductor material in a central portion of the device;

selectively etching through the layer of p-type semiconductor material and the layer of n-type SiC semiconductor material to expose underlying n-type SiC semiconductor substrate layer in a peripheral portion of the device;

thereby forming a mesa structure comprising a raised region of n-type SiC semiconductor material on the substrate layer having sidewalls and an upper surface and one or more discrete raised regions of p-type SiC semiconductor material on a central portion of the upper surface of the n-type SiC semiconductor material circumscribed by a continuous raised region of p-type SiC semiconductor material on a peripheral portion of the upper surface of the n-type SiC semiconductor material;

thermally oxidizing the device to form an oxide layer on unetched surfaces of p-type SiC semiconductor material and on etched surfaces of the device including the sidewalls of the raised region of n-type semiconductor material and on the exposed semiconductor substrate material;

optionally forming one or more layers of dielectric material on the oxide layer;

selectively etching through the oxide layer and any layers of dielectric material over the discrete p-type regions and over the continuous raised region to expose underlying p-type SiC semiconductor material;

selectively etching through the oxide layer and any layers of dielectric material over the exposed n-type SiC semiconductor material to expose underlying n-type SiC semiconductor material in the central portion of the device;

forming ohmic contacts on exposed p-type SiC semiconductor material of the discrete p-type regions and on exposed p-type SiC semiconductor material of the continuous raised region of p-type semiconductor material;

depositing Schottky metal on the ohmic contacts and on the exposed n-type SiC semiconductor material.

According to a second embodiment, a semiconductor device is provided which comprises:

a discrete raised region of n-type SiC semiconductor material on an n-type SiC semiconductor substrate layer, wherein the discrete raised region of n-type SiC semiconductor material has an upper surface and sidewalls and wherein the SiC semiconductor substrate layer extends beyond the sidewalls;

one or more discrete raised regions of p-type SiC semiconductor material on a central portion of the upper surface of the n-type SiC semiconductor material;

a continuous raised region of p-type SiC semiconductor material on a peripheral portion of the upper surface of the n-type SiC semiconductor material and circumscribing the one or more discrete raised regions of p-type SiC semiconductor material, the continuous raised region of p-type SiC semiconductor material having a peripheral edge;

ohmic contacts on the one or more discrete raised regions of p-type SiC and on the continuous raised region of p-type SiC semiconductor material;

one or more layers of dielectric material on the SiC semiconductor substrate layer extending beyond the periphery of the discrete region of n-type SiC semiconductor material and on the sidewalls of the n-type region and on the peripheral edge of the continuous raised region of p-type SiC semiconductor material; and a first metal layer on and in contact with: the ohmic contacts on the one or more discrete raised regions of p-type SiC; the ohmic contact on the continuous raised region of p-type SiC semiconductor material; and the region of n-type SiC semiconductor material.

REFERENCE NUMERALS

Figure 1:
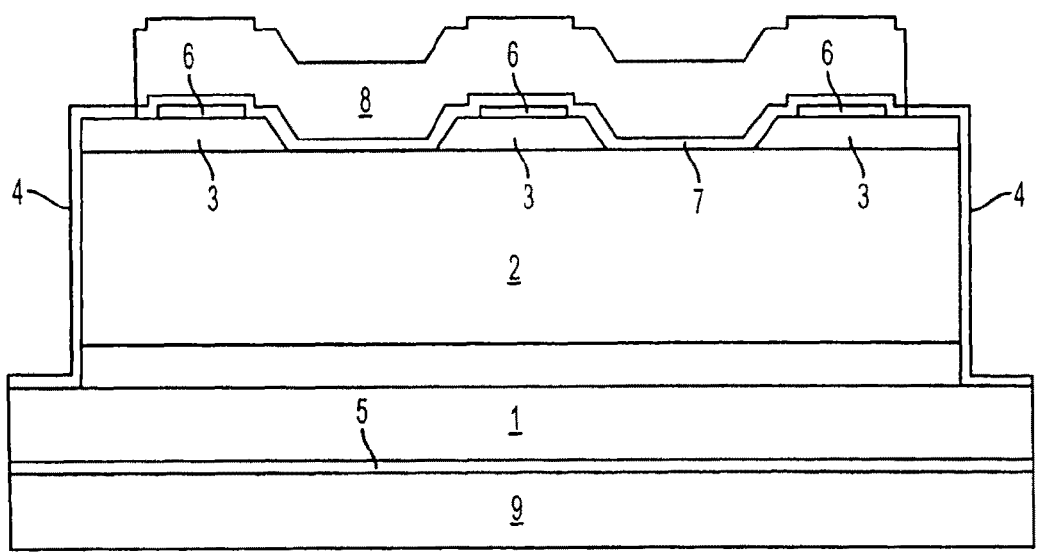
FIG. 1 is a schematic cross-section of a device according to one embodiment.

1 N-type SiC substrate (e.g., doping concentration of >1×10$^{18}$ cm$^{-3}$)
2 Epitaxially grown SiC layer (n-type). Representative thicknesses of this layer can be 0.75 μm-100 μm and representative doping concentrations can be 5×10$^{14}$-1×10$^{17}$ cm$^3$.
3 Epitaxially grown SiC layer (p-type). Representative thicknesses of this layer can be 0.2-5 μm and representative doping concentrations can be >5×10$^{18}$ cm$^{-3}$.
4 Single or multilayer dielectric stack
5 Ohmic contact to n-type SiC material
6 Ohmic contact to p-type SiC material
7 Schottky contact
8 Front-side final metallization
9 Backside final metallization

DETAILED DESCRIPTION

According to one embodiment, the device comprises monolithically integrated Schottky barrier diodes and p-type/intrinsic/n-type (PiN) junction diodes connected in parallel fashion. An exemplary device is shown in FIG. 1. At normal operating conditions, the device acts as a Schottky barrier diode wherein the majority of the current flow occurs through the Schottky contacts. At surge current conditions, however, the current flows mainly through the p-n junctions because of significant reduction of drift resistance due to conductivity modulation at high current densities. This phenomenon can be illustrated by the following mathematical expression that computes the specific resistance of the base region of a PiN diode with forward current density $J_F$ [6]:

$$R(J_F) = \frac{t}{q \cdot \mu_n \cdot N + \frac{(\mu_n + \mu_p) \cdot J_F \cdot \tau_a}{t}} \quad (1)$$

In this formula, $\mu_n$ and $\mu_p$ are electron and hole mobilities respectively, $\tau_a$, is ambipolar lifetime, and t and N represent the thickness and the doping concentration respectively of the drift (base) region. The optimal values of t and N can be chosen for the normal operation conditions (i.e., no conductivity modulation) as a function of targeted blocking voltage $V_B$ and maximum plane-junction electric field $E_{1DMAX}$ using the following formulas [7]:

$$t_{opt}(V_b, E_{1DMAX}) = \frac{3}{2} \cdot \frac{V_b}{E_{1DMAX}} \quad (2)$$

$$N_{opt}(V_b, E_{1DMAX}) = \frac{4}{9} \cdot \frac{\varepsilon_0 \cdot \varepsilon_r}{q} \cdot \frac{E_{1DMAX}^2}{V_b}$$

Figure 2:
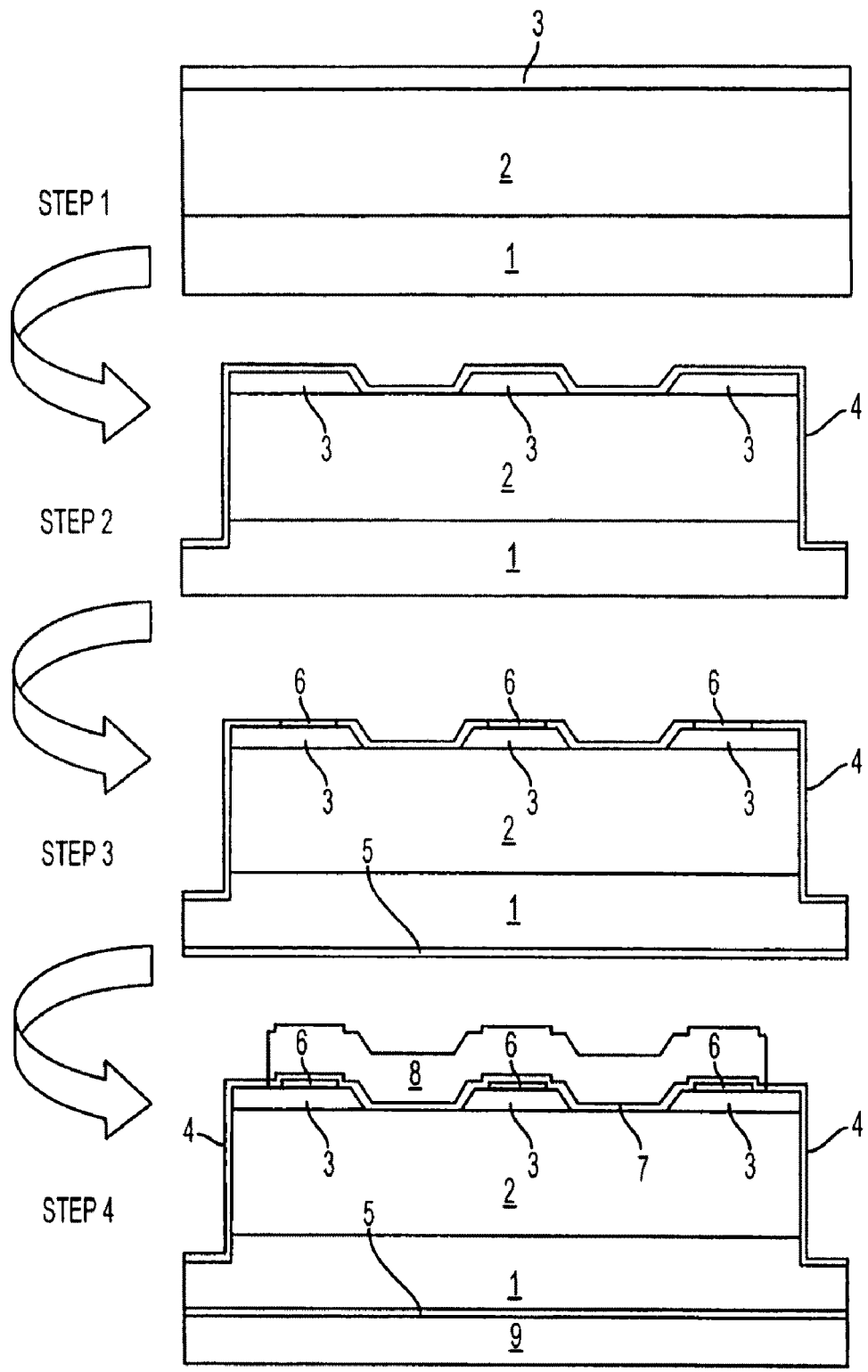
FIG. 2 is a schematic process flow for the fabrication of the device of FIG. 1.

An exemplary fabrication process of the described device may consist of the following macro-steps as shown in FIG. 2:

1. Growth of epitaxial stack
2. Selective plasma etches through p-type layer (3) down to n-type layer (2) to form p-type islands, and through p-type layer (3) and n-type layer (2) down to n-type substrate (1) layer to form device mesa, followed by thermal oxidation and optional deposition of additional dielectric layers to form dielectric stack (4). Thermal oxidation step consumes surface damage caused by plasma etch of SiC.
3. Formation of ohmic contact (5) on backside of n-type substrate (1) resulting in ohmic contact to n-type material followed by selective formation of ohmic contacts (6) on p-type islands resulting in ohmic contacts to p-type material.
4. Deposition of Schottky contact (7) and front-side final metal (8) resulting in metal stack (7-8) followed by deposition of backside final metal (9) resulting in backside metallization.

Metallization steps 3 and 4 include selective etching (e.g., wet etching) through the dielectric stack (4) in order to expose SiC surface prior to metal deposition and remove surface damage caused by plasma etching of SiC.

Figure 3:
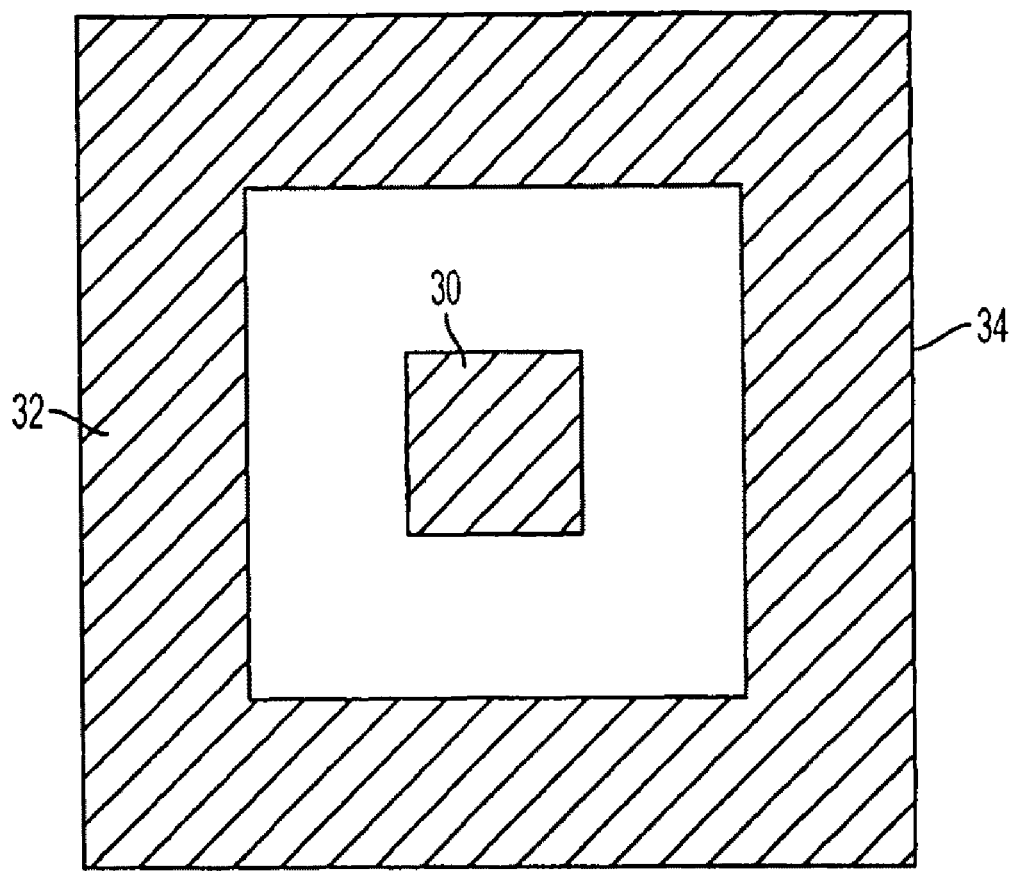
FIG. 3 shows an exemplary layout of p-type regions on the device mesa.

FIG. 3 shows an exemplary layout of a heavily doped p-type region (30) in a device according to one embodiment. Although a single square shaped region is shown in FIG. 3, the shape, number, and area of the p-type regions may vary. An outer p-type ring 32 is also shown as is the device mesa edge 34. The outer p-type ring 32 protects metal-semiconductor junctions from the highest electric field that occurs at the edge of the device. A metal-semiconductor junction exhibits significantly higher leakage current than that of a p-n junction for the same applied electric field due to thermionic field emission through the Schottky barrier [8].

As shown in FIG. 1, the described device employs mesa edge termination for protection from high electric field. Mesa etching through the main junction and voltage blocking layer is theoretically the most efficient method to eliminate electric field enhancement caused by two-dimensional effects. Assuming that there is no interface charge on the mesa sidewalls, the electric field distribution in the device can be calculated using the one-dimensional Poisson equation.

The method described above is relatively simple from the fabrication point of view because it does not need difficult-to-control and expensive fabrication steps such as high-temperature ion implantation and post-implant annealing required, for example, to form an aluminum-implanted junction termination extension (JTE) edge termination. Because the depletion region in mesa-terminated devices does not spread laterally under reverse bias, this method also allows for more efficient use of area than with other edge termination techniques, resulting in lower cost and higher yield.

Figure 4A:
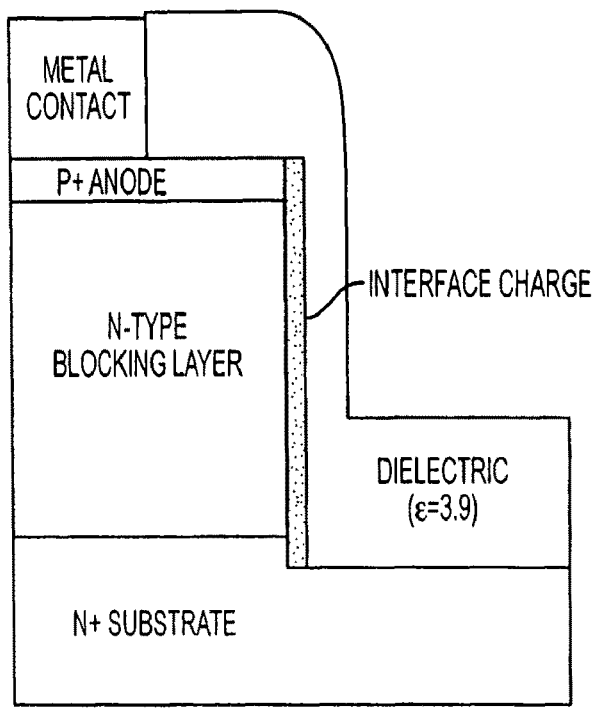
FIG. 4A is a schematic cross-section of a mesa-terminated 4H—SiC PiN diode.
Figure 4B:
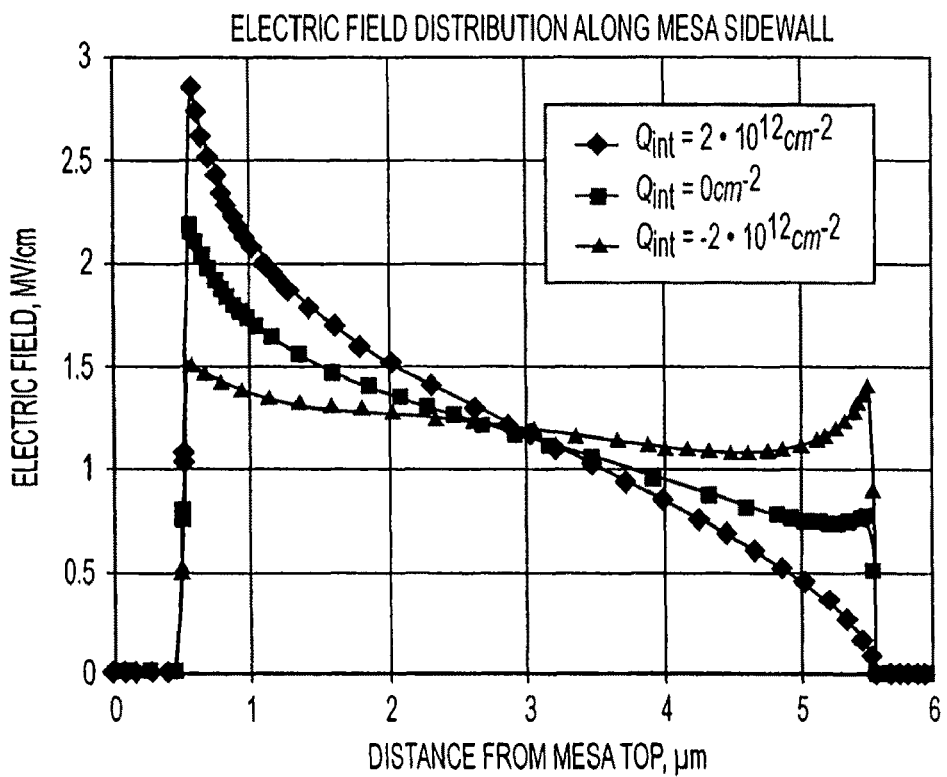
FIG. 4B is a graph showing electric field distribution along the mesa sidewall for different interface charge densities at a reverse bias of 600 V.

Despite the numerous advantages, mesa edge termination requires careful sidewall passivation in order to minimize the interface trap density and the amount of fixed charge stored at or near the mesa sidewalls. FIGS. 4A and 4B illustrate the influence of the interface charge on the field distribution along the sidewall of a mesa-terminated 4H—SiC PiN diode reverse biased to 600 V. In particular, FIG. 4A is a schematic cross-section of a mesa-terminated 4H—SiC PiN diode. FIG. 4B is a graph showing electric field distribution along the mesa sidewall for different interface charge densities at a reverse bias of 600 V. As shown in FIG. 4B, a certain amount of negative charge in the passivation layer can be beneficial, since it further reduces the maximum electric field along the mesa sidewalls. In practice, however, the fixed charge in the silicon dioxide used for passivation in SiC devices is usually positive and a negative charge introduced by interface traps and electrons injected into the passivation layer may cause memory effects and compromise high-temperature performance of the device.

To illustrate the almost one-dimensional nature of the field distribution along the mesa sidewalls, the surface electric field has been investigated as a function of applied reverse bias.

Figure 5:
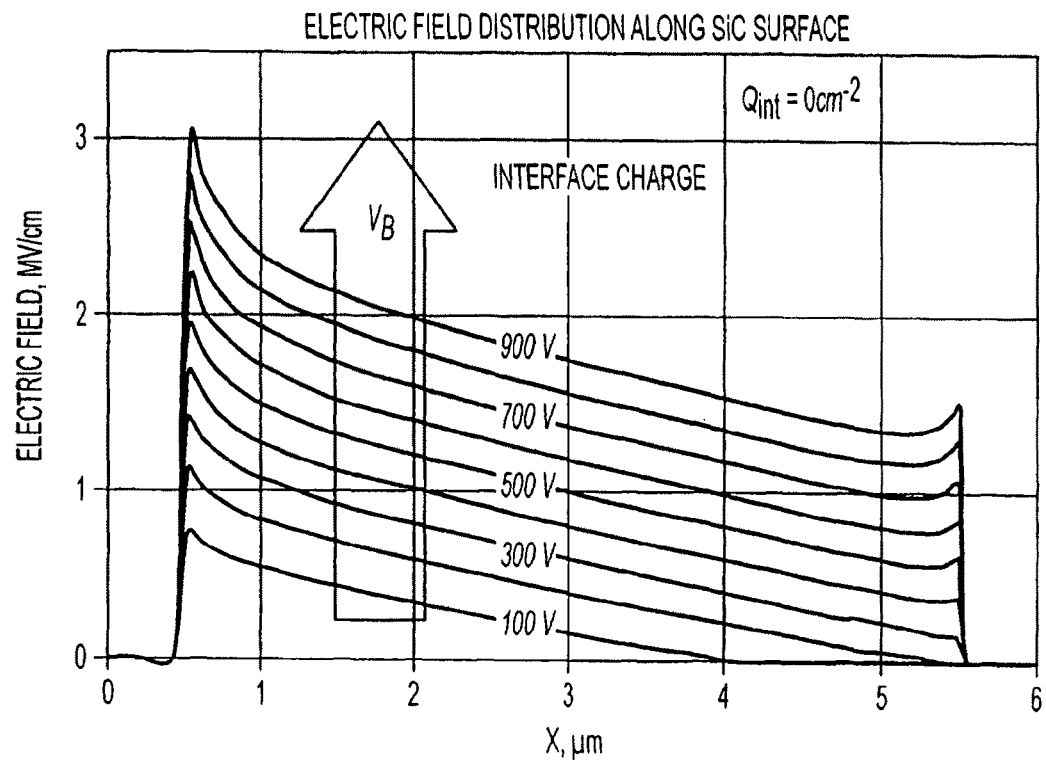
FIG. 5 is a graph showing the dynamics of electric field distribution along the mesa sidewall in 4H—SiC PiN diode assuming zero interface charge density.

FIG. 5 shows the family of mesa surface field distributions at reverse voltages from 100 V to 900 V when no surface charge is present. As shown in FIG. 5, the surface field experiences a linear increase with applied reverse bias, and the field distribution maintains adequate linearity along the mesa sidewall regardless of the applied bias.

EXPERIMENTAL

Figure 6:
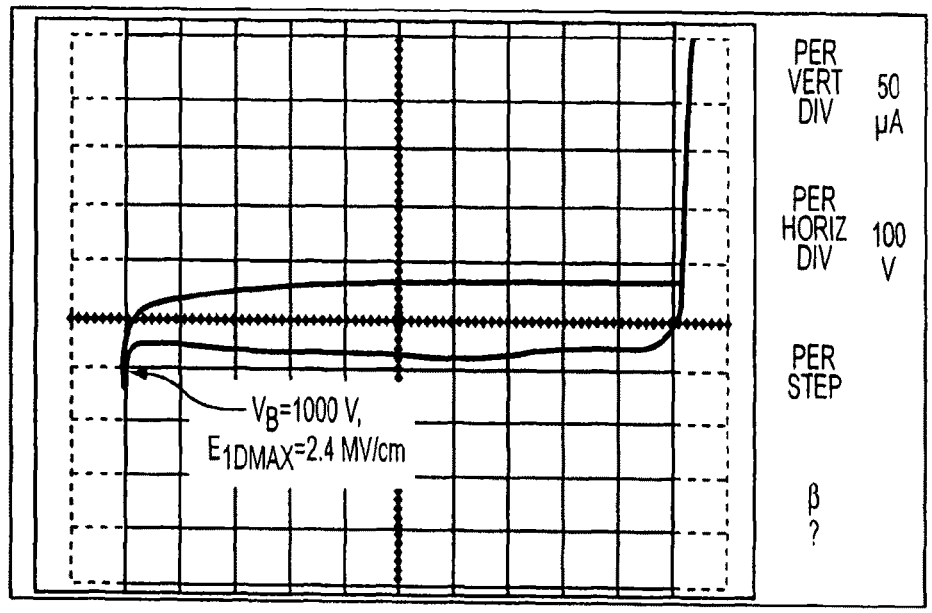
FIG. 6 illustrates non-destructive avalanche breakdown measured on a mesa-terminated diode with 5.7 μm, 1.25×10$^{16}$ cm$^{-3}$ base layer.
Figure 7A:
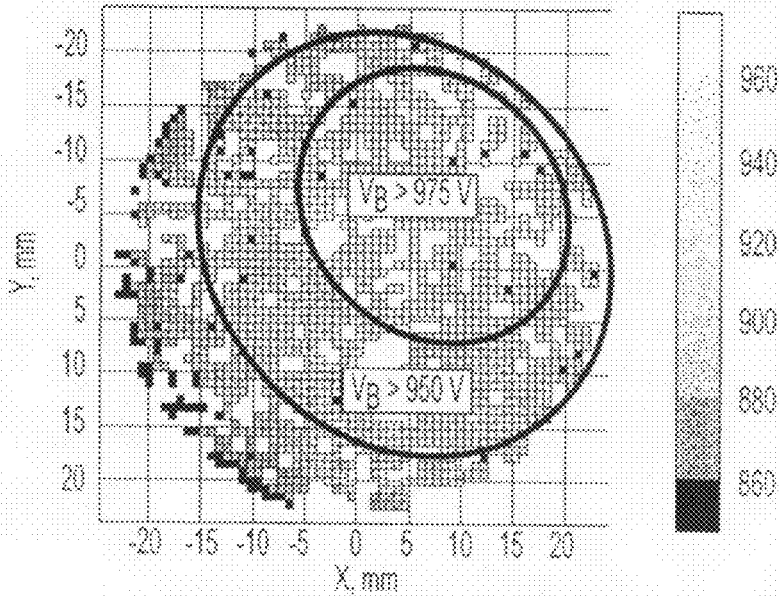
FIGS. 7A and 7B are wafer maps showing measured breakdown voltages (A) and extracted $E_{1DMAX}$ (B) on the same substrate. Reverse bias measurements were done with 25 V step. Devices with $V_B$<850 V are excluded from the maps.

4H—SiC PiN diodes were fabricated with a voltage blocking layer designed for the maximum plane-junction electric field $E_{1DMAX}$=1.8 MV/cm at $V_B$=600 V and employing mesa etching for edge termination. After completing the fabrication, on-wafer I-V measurements were done in Fluorinert™ using Keithley 237 SMU and a Tektronix 576 curve tracer. The devices with both types of edge termination demonstrated a reversible avalanche breakdown. FIG. 6 shows a non-destructive avalanche breakdown measured on a mesa-terminated diode using a Tektronix 576 curve tracer. Wafer-scale measurements of the breakdown voltage were done with a 25 V step increment of reverse bias. A typical $V_B$ map is shown in FIG. 7A. The maximum 1-D electric field $E_{1DMAX}$ was then extracted from the measured epi parameters and breakdown voltage using expression $$E_{1DMAX} = \frac{V_B}{t} + \frac{q \cdot t \cdot N}{2 \cdot \varepsilon_0 \cdot \varepsilon_r} \quad (3)$$

Figure 7B:
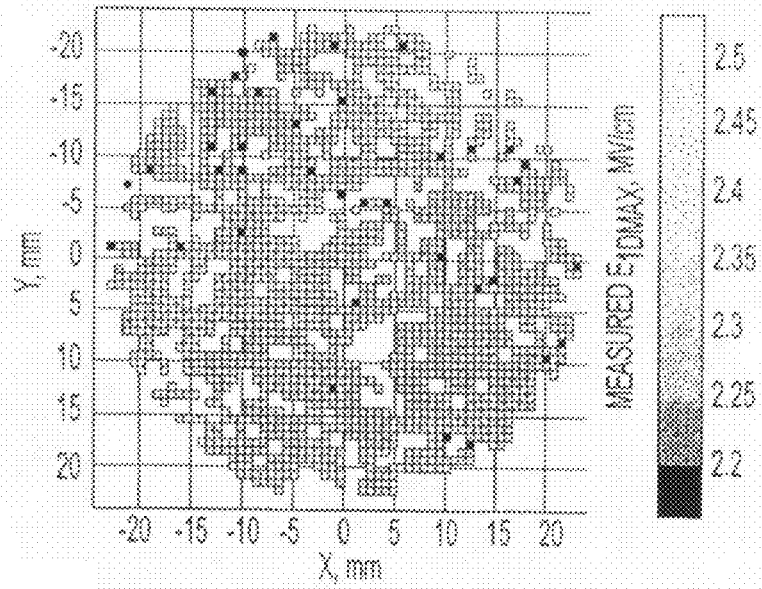

On mesa-terminated diodes, the mean value of this field was found to be of 2.4 MV/cm with a standard deviation σ=35 kV/cm. Such small standard deviation from the mean value corresponded to $E_{1DMAX}$ uniformity of 1.45%. A map of $E_{1DMAX}$ is shown in FIG. 7B. The experimentally achieved $E_{1DMAX}$ of 2.4 MV/cm corresponds to ~93% of the "theoretical value" of critical electric field in 4H—SiC given by Reference [9]:

$$E_c = \frac{2.49 \times 10^6}{1 - \frac{1}{4}\log_{10}\left(\frac{N_D}{10^{16} \text{cm}^{-3}}\right)} V/\text{cm}. \quad (4)$$

Figure 8:
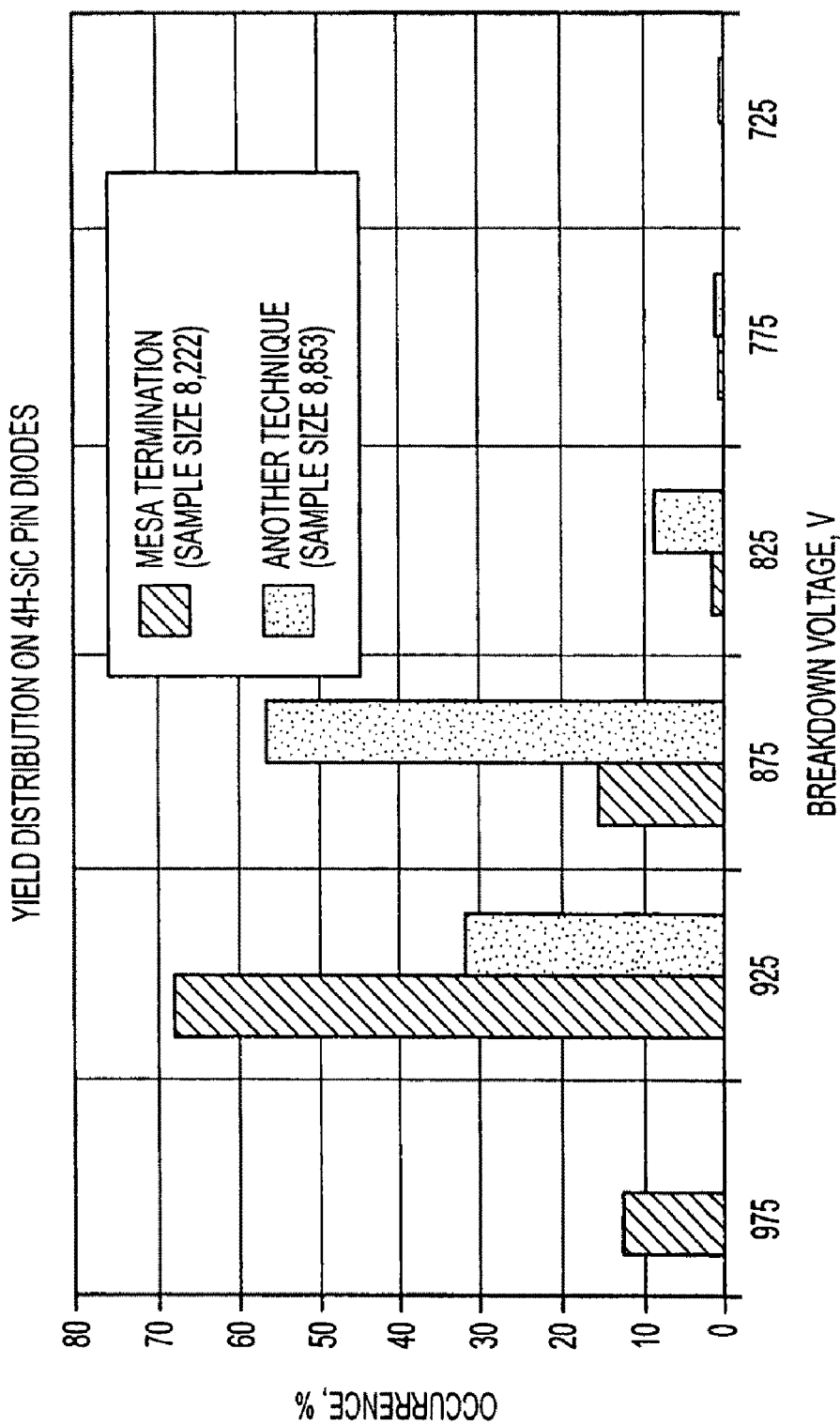
FIG. 8 is a graph showing a comparison of yield distribution between 4H—SiC PiN diodes with different edge termination techniques.

Although the charge conditions on the mesa sidewalls are unknown, the simulation results suggest that the electric field may experience a certain non-linear increase as shown in FIGS. 4 and 5. In this case, the electric field reaches its true critical value at the anode junction that triggers an avalanche breakdown. The majority of the mesa-terminated devices measured on all 3 substrates (5584 of 8222 tested, or 67.9%) demonstrated an average breakdown voltage ranging from 925 V to 975 V. FIG. 8 shows a comparison between yield distributions of the diodes fabricated using mesa edge termination and a different edge termination technique.

Although devices having a single layer of n-type SiC semiconductor material is described above, the device may comprise multiple layer of n-type SiC semiconductor material. For example, the device may comprise a first layer of n-type SiC semiconductor material in contact with the SiC substrate layer and a second layer of n-type SiC semiconductor material on the first layer of n-type SiC semiconductor material. The second layer of n-type SiC semiconductor material may have a lower doping concentration than the first layer of n-type SiC semiconductor material.

An exemplary material for forming ohmic contacts is nickel. Other ohmic contact materials for SiC, however, can also be used.

Suitable n-type dopants for SiC include nitrogen and phosphorous. Nitrogen is a preferred n-type dopant. Suitable p-type dopants for silicon carbide include boron and aluminum. Aluminum is a preferred p-type dopant. The above materials are merely exemplary, however, and any n or p-type dopant for silicon carbide can be used.

Although specific doping levels and thicknesses of the various layers of the device are described above, the doping levels and thicknesses of the various layers can be varied to produce a device having desired characteristics for a particular application.

Doping of the SiC layers can be performed in-situ during epitaxial growth of each of these layers on a SiC substrate. The SiC layers can be formed by any epitaxial growth method known in the art, including CVD, molecular beam and sublimation epitaxy. The doped SiC layers can be formed by doping in-situ during epitaxial growth wherein dopant atoms are incorporated into the silicon carbide during growth.

While the foregoing specification teaches the principles of the present invention, with examples provided for the purpose of illustration, it will be appreciated by one skilled in the art from reading this disclosure that various changes in form and detail can be made without departing from the true scope of the invention.

CITED REFERENCES

[1] B. J. Baliga, "Analysis of a high-voltage merged p-i-n/Schottky (MPS) rectifier," *IEEE Electron Device Letters*, Vol. 8, Issue 9, September 1987 pp.: 407-409

[2] W. V. Muench and I. Plaffeneder: "Breakdown field in vapor-grown silicon carbide p-n junctions," *Journal of Applied Physics*, Vol. 48, No. 11, November 1977

[3] V. E. Chelnokov, A. M. Strel'chuk, P. A. Ivanov; G. Lentz, C. Parniere: "Silicon carbide p-n structures as power rectifiers," *Proceedings of the 6th International Symposium on Power Semiconductor Devices and ICs*, 1994. ISPSD '94, pp.: 253-256

[4] K. V. Vasilevskki, K. Zekentes, A. V. Zorenko, and L. P. Romanov: "Experimental Determination of Electron Drift Velocity in 4H—SiC p+-n-n+ Avalanche Diodes," *IEEE Electron Device Letters*, Vol. 21, No. 10, October 2000 pp.: 485-487

[5] L. Yuan, J. A. Cooper, Jr., M. R. Melloch, and K. J. Webb: "Experimental Demonstration of a Silicon Carbide IMPATT Oscillator," *IEEE Electron Device Letters*, Vol. 22, No. 6, June 2001, pp.: 266-268

[6] D. T. Morisette and J. A. Cooper, Jr: "Theoretical Comparison of SiC PiN and Schottky Diodes Based on Power Dissipation Considerations," *IEEE Transactions on Electron Devices*, Vol. 49, No. 9, September 2002, pp.: 1657-1664

[7] I. Sankin, J. B. Casady, "Power SiC MOSFETs," book chapter: *Advances in Silicon Carbide Processing and Applications*, S. E. Saddow and A. Agrawal, Editors

[8] H. Saitoh, T. Kimoto, and H. Matsunami: "Origin of Leakage current in SiC Schottky Barrier Diodes at High Temperature," Material Science Forum Vols. 457-460 (2004) pp. 997-1000

[9] A. O. Konstantinov, Q. Wahab, N. Nordell, U. Lindefelt: "Ionization rates and critical fields in 4H silicon carbide," *Appl. Phys. Lett.*, Vol. 71, No. 1, 7 Jul. 1997, pp.: 90-92

What is claimed is:

1. A method of making a semiconductor device comprising:
    selectively etching through a layer of p-type SiC semiconductor material on a layer of n-type SiC semiconductor material on an n-type SiC semiconductor substrate layer to expose the underlying n-type SiC semiconductor material in a central portion of the device; and
    selectively etching through the layer of p-type semiconductor material and the layer of n-type SiC semiconductor material to expose the underlying n-type SiC semiconductor substrate layer in a peripheral portion of the device;
    thereby forming a mesa structure comprising a raised region of n-type SiC semiconductor material on the n-type SiC semiconductor substrate layer having sidewalls and an upper surface and one or more discrete raised regions of p-type SiC semiconductor material on a central portion of the upper surface of the n-type SiC semiconductor material circumscribed by a continuous raised region of p-type SiC semiconductor material on a peripheral portion of the upper surface of the n-type SiC semiconductor material, wherein the continuous raised region of p-type SiC semiconductor material comprises an inner edge and an outer edge;
    thermally oxidizing the semiconductor device to form an oxide layer on unetched surfaces of p-type SiC semiconductor material and on etched surfaces of the semiconductor device including the sidewalls of the raised region of n-type semiconductor material and on the exposed semiconductor substrate layer;
    optionally forming one or more layers of dielectric material on the oxide layer;
    selectively etching through the oxide layer and any layers of dielectric material over the discrete p-type regions and over the continuous raised region to expose the underlying p-type SiC semiconductor material;
    selectively etching through the oxide layer and any layers of dielectric material over the exposed n-type SiC semiconductor material to expose the underlying n-type SiC semiconductor material in the central portion of the semiconductor device;
    forming ohmic contacts on the exposed p-type SiC semiconductor material of the discrete p-type regions and on the exposed p-type SiC semiconductor material of the continuous raised region of p-type semiconductor material;
    depositing Schottky metal on the ohmic contacts and on the exposed n-type SiC semiconductor material.

2. The method of claim 1, further comprising forming a metal layer on the Schottky metal.

3. The method of claim 1, further comprising depositing an ohmic contact on the semiconductor substrate layer opposite the layer of n-type semiconductor material.

4. The method of claim 3, further comprising forming a metal layer on the ohmic contact on the semiconductor substrate layer.

5. The method of claim 1, wherein the n-type SiC substrate layer has a doping concentration of $>1\times10^{18}$ cm$^{-3}$.

6. The method of claim 1, wherein the n-type SiC semiconductor layer has a doping concentration of $5\times10^{14}$-$1\times10^{17}$ cm$^{-3}$.

7. The method of claim 1, wherein the one or more discrete raised regions of p-type SiC semiconductor material and the continuous raised region of p-type SiC semiconductor material each have a doping concentration of $5\times10^{14}$-$1\times10^{17}$ cm$^{-3}$.

8. The method of claim 1, wherein the n-type SiC semiconductor layer has a thickness of 0.75 µm-100 µm.

9. The method of claim 1, wherein the one or more discrete raised regions of p-type SiC semiconductor material and the continuous raised region of p-type SiC semiconductor material each have a thickness of 0.2-5 µm.

10. The method of claim 1, wherein the ohmic contact comprises nickel.

11. The method of claim 1, wherein the p-type SiC semiconductor material is doped with aluminum.

12. The method of claim 1, wherein the n-type SiC semiconductor material is doped with nitrogen.

13. The method of claim 1, wherein the continuous raised region of p-type SiC semiconductor material on the peripheral portion of the upper surface of the n-type SiC semiconductor material is a ring.

14. The method of claim 13, wherein the ring is rectangular or square.

15. The method of claim 1, wherein the outer edge of the continuous raised region of p-type SiC semiconductor material aligns with the sidewalls of the mesa structure.

16. The method of claim 1, wherein the inner edge of the continuous raised region of p-type SiC semiconductor material is spaced from the one or more discrete raised regions of p-type SiC semiconductor material on the central portion of the upper surface of the n-type SiC semiconductor material.

* * * * *

UNITED STATES PATENT AND TRADEMARK OFFICE
CERTIFICATE OF CORRECTION

| | | |
|---|---|---|
| PATENT NO. | : 7,960,198 B2 | Page 1 of 1 |
| APPLICATION NO. | : 11/819646 | |
| DATED | : June 14, 2011 | |
| INVENTOR(S) | : Igor Sankin et al. | |

It is certified that error appears in the above-identified patent and that said Letters Patent is hereby corrected as shown below:

On the front page of the patent, the address of the assignee which appears as "Starkvilles, MS (US)" should instead read --Starkville, MS (US)--

Signed and Sealed this
Second Day of August, 2011

David J. Kappos
*Director of the United States Patent and Trademark Office*